United States Patent
Xiaochun et al.

(10) Patent No.: US 7,402,459 B2
(45) Date of Patent: Jul. 22, 2008

(54) QUAD FLAT NO-LEAD (QFN) CHIP PACKAGE ASSEMBLY APPARATUS AND METHOD

(75) Inventors: Tan Xiaochun, Shanghai (CN); Li Yunfang, Shanghai (CN)

(73) Assignee: Shanghai Kaihong Technology Co., Ltd., Shanghai (CN)

( * ) Notice: Subject to any disclaimer, the term of this patent is extended or adjusted under 35 U.S.C. 154(b) by 95 days.

(21) Appl. No.: 11/483,860

(22) Filed: Jul. 10, 2006

(65) Prior Publication Data
US 2008/0009103 A1    Jan. 10, 2008

(51) Int. Cl.
*H01L 21/44* (2006.01)
*H01L 21/48* (2006.01)
*H01L 21/50* (2006.01)

(52) U.S. Cl. .................. 438/106; 438/123; 438/127; 257/E21.311; 257/E21.499; 257/E21.502; 257/E21.503; 257/E21.506

(58) Field of Classification Search ............. 438/106, 438/55, 64, 111, 112, 113, 118, 123, 124, 438/126, 127, 460, 687, 650, 686; 257/666, 257/678, 690

See application file for complete search history.

(56) References Cited

U.S. PATENT DOCUMENTS

| | | | | |
|---|---|---|---|---|
| 6,258,314 B1 * | 7/2001 | Oida et al. | | 264/511 |
| 6,395,585 B2 * | 5/2002 | Brandl | | 438/127 |
| 6,608,366 B1 * | 8/2003 | Fogelson et al. | | 257/666 |
| 6,858,470 B1 * | 2/2005 | Han et al. | | 438/112 |
| 7,091,596 B2 * | 8/2006 | Han et al. | | 257/687 |

* cited by examiner

*Primary Examiner*—David Nhu
(74) *Attorney, Agent, or Firm*—Chad R. Walsh; Fountainhead Law Group PC

(57) ABSTRACT

In one embodiment the present invention includes a method of fabricating a quad flat no-lead (QFN) chip package. The method includes forming a stamped lead frame; forming a die pad and a lead shrink on one side of the stamped lead frame; mounting a die on the die pad; performing wire bonding; encapsulating the die and the wire bond with a molding compound; removing the stamped lead frame after encapsulating; and sawing the molding compound after the stamped lead frame has been removed. Such method results in improved quality of wire leads, improved lifespan of cutting blades, and reduction of burrs as compared to many existing methods of fabricating QFN chip packages.

14 Claims, 4 Drawing Sheets

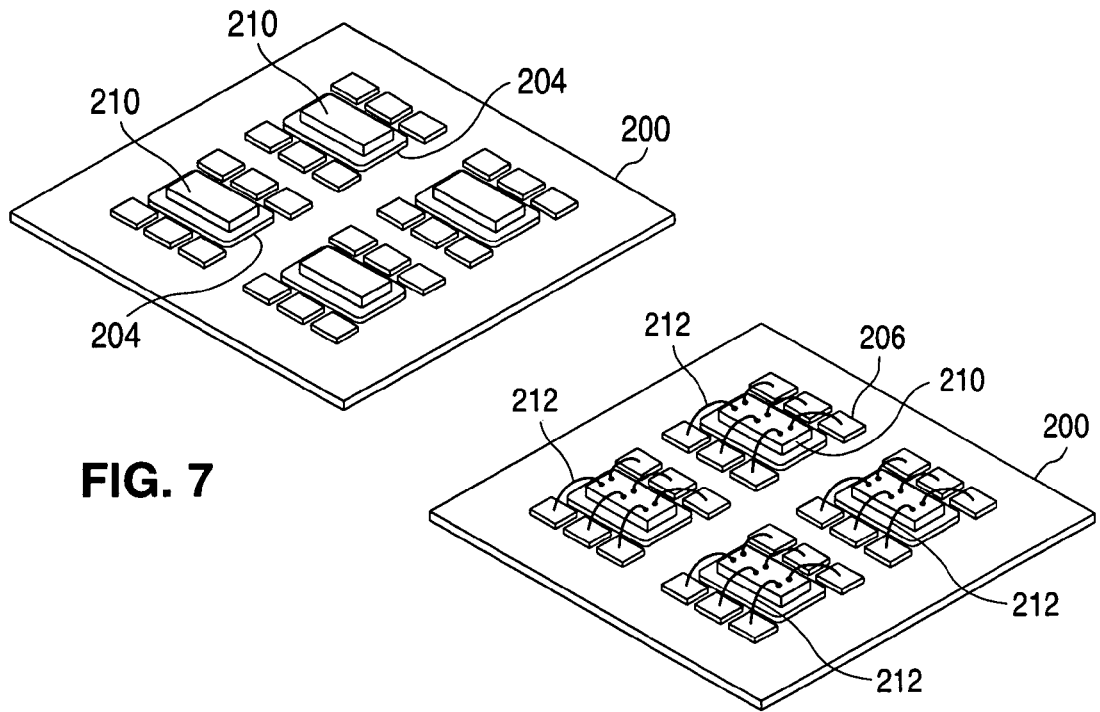
FIG. 7
FIG. 8
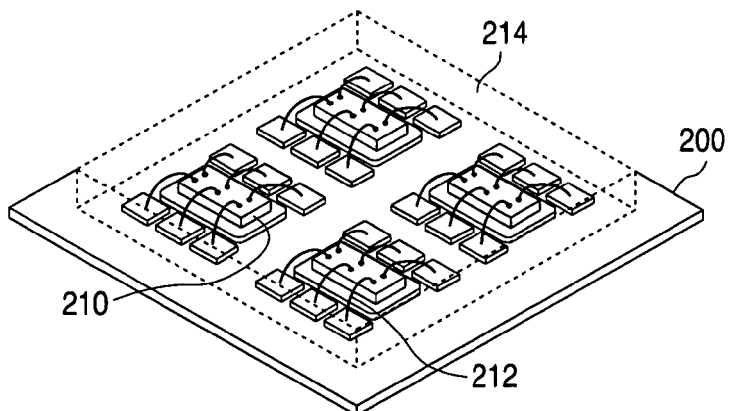
FIG. 9
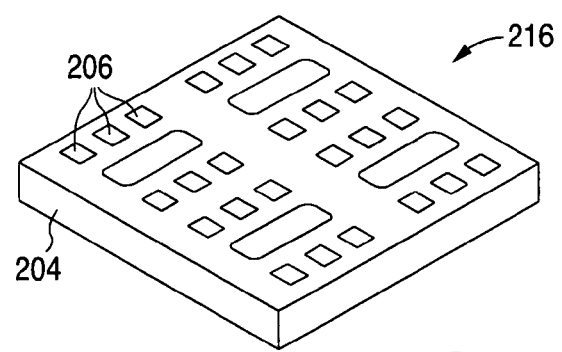
FIG. 10

QUAD FLAT NO-LEAD (QFN) CHIP PACKAGE ASSEMBLY APPARATUS AND METHOD

CROSS REFERENCE TO RELATED APPLICATIONS

Not applicable.

BACKGROUND

The present invention relates to quad flat no-lead (QFN) microchip package fabrication processes, and in particular, to extending the life of cutting blades used in QFN package fabrication processes.

Existing QFN packages are often made using the following procedure. A lead frame is provided. Often the lead frame has a special tape on one side. The tape is used for wire bond vacuum and to provide support for the lead frame. Next, the dies are placed on the lead frame, and wire bonding is performed. Then, a molding compound is applied to encapsulate the lead frame, the dies, and the wire leads. Finally, the encapsulated dies are sawed apart into individual QFN package units.

The thickness of current lead frames may vary; common thicknesses include 0.127 um, 0.152 um, and 0.203 um. The lead frame material may be a copper alloy material such as Olin C7025. The special tape used may vary as well. Common types of tape include Nitto tape and Hitachi tape.

A number of problems arise from the above-described fabrication process. First, problems arise relating to the special tape. If the lead frame includes one type of special tape, the tape often outgases due to the temperatures involved in the wire bonding process, and the outgas negatively affects the wire bonding quality. If the lead frame includes another type of special tape, warpage issues arise during lead frame production.

Second, since the lead frame is encapsulated within the molding compound, during the sawing process the saw must also cut the lead frame. The metal structure of the lead frame reduces the lifespan of the saw blade.

Third, sawing the metal lead frame often results in burrs. Burrs are undesirable because they may cause quality and reliability issues when the device is used on the circuit board. Specifically, the burrs may contribute to short circuits during device testing.

Thus, there is a need for an improved QFN package fabrication processes. The present invention solves these and other problems by using a different type of lead frame.

SUMMARY

Embodiments of the present invention improve upon the process of fabricating quad flat no-lead (QFN) chip packages. In one embodiment, the present invention includes a method of fabricating a chip package. The method includes forming a stamped lead frame; forming a die pad and a lead shrink on one side of the stamped lead frame; mounting a die on the die pad; performing wire bonding; encapsulating the die and the wire bond with a molding compound; removing the stamped lead frame after encapsulating; and sawing the molding compound after the stamped lead frame has been removed.

In another embodiment, the present invention includes a chip package produced by the above method.

The above method increase the lifespan of the saw blades as compared to many existing methods of fabricating QFN chip packages, among other benefits.

The following detailed description and accompanying drawings provide a better understanding of the nature and advantages of the present invention.

BRIEF DESCRIPTION OF THE DRAWINGS

FIG. 7 is a top perspective view of a lead frame and related structures according to an embodiment of the present invention.

FIG. 8 is a top perspective view of a lead frame and related structures according to an embodiment of the present invention.

FIG. 9 is a top perspective view of a lead frame and related structures according to an embodiment of the present invention.

FIG. 10 is a bottom perspective view of a strip block according to an embodiment of the present invention.

DETAILED DESCRIPTION

Described herein are techniques for QFN chip package fabrication processes. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include obvious modifications and equivalents of the features and concepts described herein.

The following description describes various methods and processes. Although the particular method steps are discussed in a particular order, such discussion is mainly for clarity of presentation. It should be recognized that such order may be varied, and some steps may be performed in parallel. One step need only follow another step when the other step must be completed before the one step begins.

Figure 1:
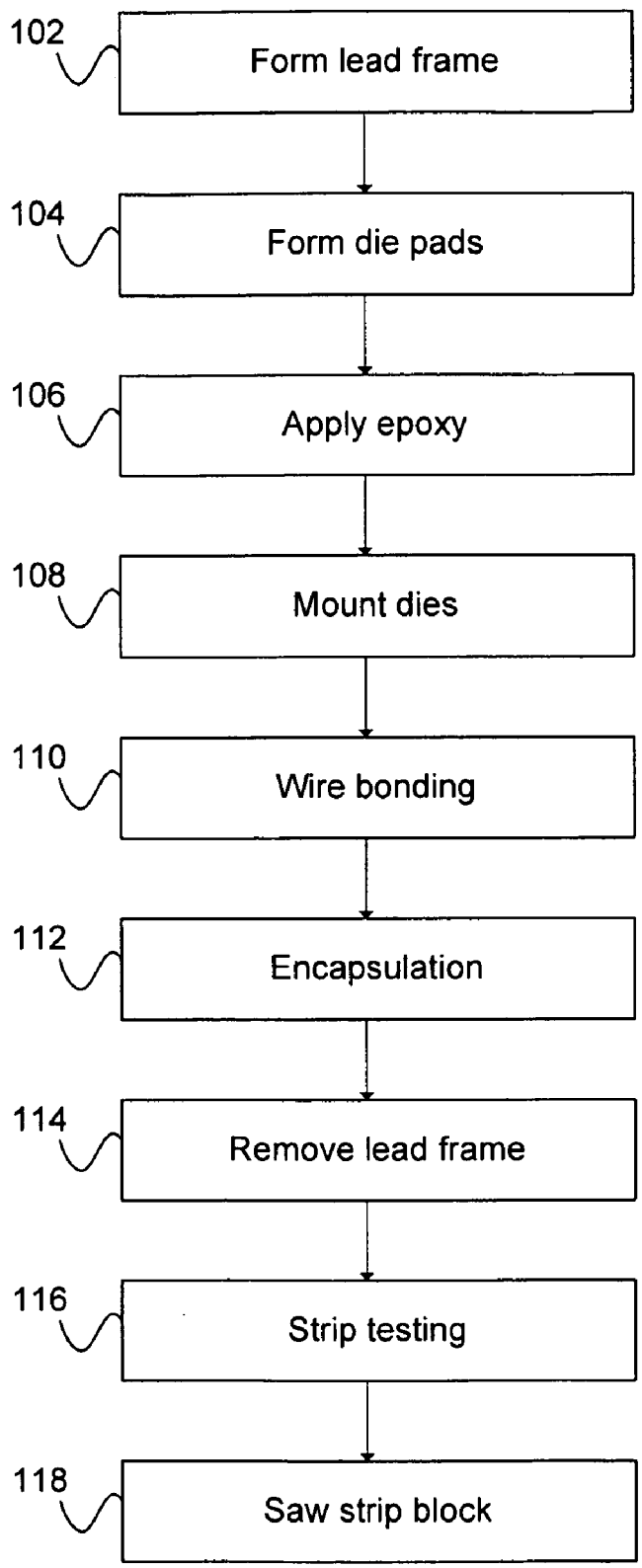
FIG. 1 is a block diagram of a method of fabricating a QFN chip package according to an embodiment of the present invention.

FIG. 1 is a block diagram of a method 100 of fabricating a QFN chip package according to an embodiment of the present invention. FIGS. 2-15 are various illustrative diagrams that are further described with reference to the method steps to which they most closely relate.

In step 102, the lead frame is formed from a thin metal material, such as a copper alloy material. Holes are stamped in the thin metal material to form the lead frame. Suitable materials for the lead frame include Olin C7025 and EFTEC 64T. Various thicknesses of the lead frame are appropriate, with a range of approximately 0.10 mm to 0.30 mm.

Figure 2:
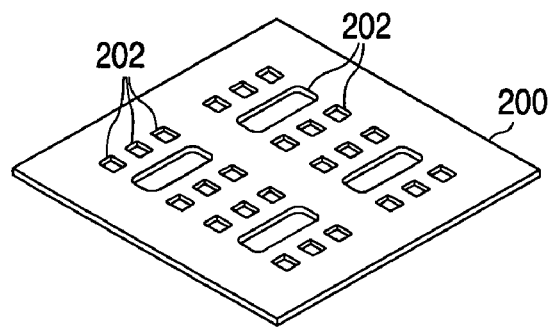
FIG. 2 is a perspective view of a stamped lead frame according to an embodiment of the present invention.

FIG. 2 is a perspective view of a stamped lead frame 200. The stamped lead frame 200 includes a number of holes 202. The holes 202 may be different sizes, as appropriate, for the various types of structures that are to be formed on the lead frame 200. For example, the holes corresponding to the die pads may be larger than those for the lead shrinks (discussed more fully below). The lead frame size is determined by the mold chase. It can be changed from small size to large size. The numbers and sizes for the holes are determined by the QFN unit pin size and layout.

In step 104, the die pads and lead shrinks are formed on one side of the stamped lead frame. This side may be referred to as the top side. The die pads are used in die placement (discussed below). The lead shrinks connect to the wire leads (discussed below).

Figure 3:
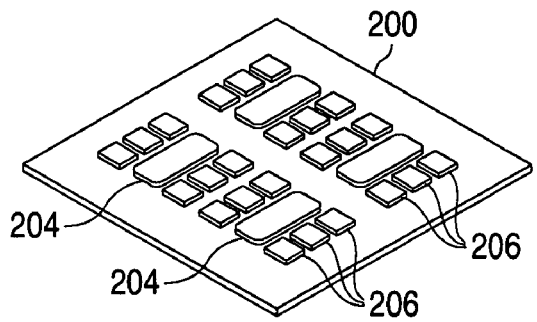
FIG. 3 is a top perspective view of a lead frame according to an embodiment of the present invention.
Figure 4:
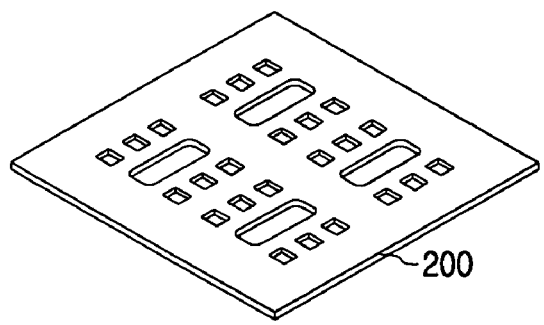
FIG. 4 is a bottom perspective view of the lead frame shown in FIG. 3.
Figure 5:
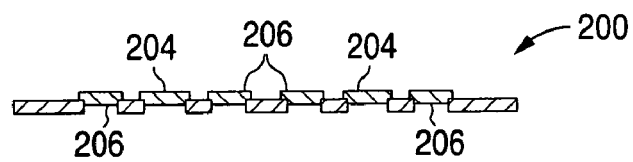
FIG. 5 is a cross-sectional view of the lead frame shown in FIG. 3.

FIG. 3 is a top perspective view of the lead frame 200 showing the die pads 204 and the lead shrinks 206. FIG. 4 is a bottom perspective view of the lead frame 200 shown in FIG. 3. FIG. 5 is a cross-sectional view of the lead frame 200 shown in FIG. 3.

Figure 6:
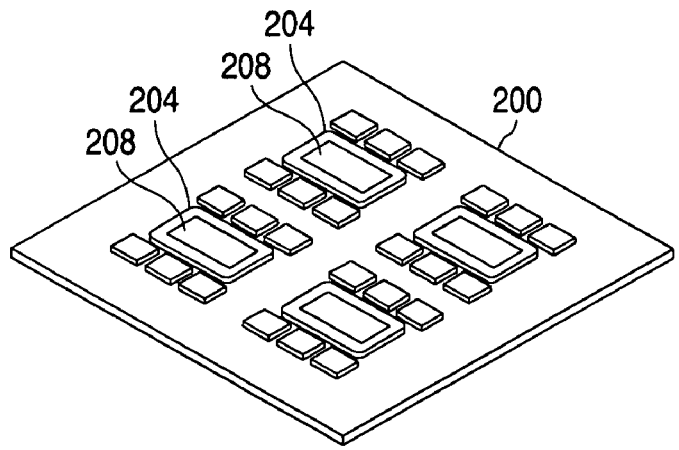
FIG. 6 is a top perspective view of a lead frame and related structures according to an embodiment of the present invention.

In step 106, epoxy is applied to the die pads. FIG. 6 is a top perspective view of the lead frame 200 showing the epoxy 208 having been applied to the die pads 204.

In step 108, the dies are mounted on the die pads via the epoxy. FIG. 7 is a top perspective view of the lead frame 200 showing the dies 210 having been mounted on the die pads 204.

In step 110, wire bonding is performed. In wire bonding, a wire is extruded to connect a pad on one of the dies to a corresponding one of the lead shrinks. In this manner, an electrical connection is made between the die and the lead shrink. Such wires may be referred to as wire leads. Wire leads may be made from conductive materials, such as gold.

FIG. 8 is a top perspective view of the lead frame 200 showing the wire leads 212 having been connected between the dies 210 and the lead shrinks 206. As the lead frame does not include mounting tape, there is no outgassing involved from the tape resulting from the temperatures involved in wire bonding. Thus, the wire bonding quality is improved as compared to wire bonding performed when the lead frame includes mounting tape.

In step 112, encapsulation is performed. Encapsulation involves applying a molding compound to encapsulate the dies, the wire leads, and the other parts that are to be internal in the completed QFN package. Epoxy may be used as the molding compound. The molding compound is applied to the side of the lead frame where the dies and wire leads have been attached, which may be referred to as the top side. The resulting encapsulated structure that includes the dies may be referred to as a strip or a strip block.

FIG. 9 is a top perspective view of the lead frame 200 showing the molding compound 214 having been applied. As can be seen, the molding compound 214 encapsulates the dies 210 and the wire leads 212. Referring back to FIG. 5, note the small concavity space around the die pads 204 and the lead shrinks 206 on the top side of the lead frame 200. The small concavity space allows the molding compound 214 to fill in and lock in the die pads 204 and the lead shrinks 206.

In step 114, the lead frame is removed from the strip block. As the lead frame is made from a thin metal material, the lead frame peels away easily. FIG. 10 is a bottom perspective view of the strip block 216 with the lead frame having been removed. With the lead frame removed, the die pads 204 and the lead shrinks 206 are exposed. The die pads 204 and the lead shrinks 206 have a fixed standoff from the molding compound surface due to their original placement on the lead frame. Such a standoff may vary depending upon the thickness of the lead frame, and upon the distance of the lead in the frame. Desirable ranges for the standoff are between approximately 0.02 mm and 0.10 mm. The standoff offers good solderability once the QFN packages have been separated into individual units. The exposed die pads 204 and lead shrinks 206 may be plated at this point.

In step 116, strip testing may be performed. Strip testing involves testing the electrical connections of the strip block prior to the dies being separated into individual QFN units. Marking may also be performed at this stage.

Figure 11:
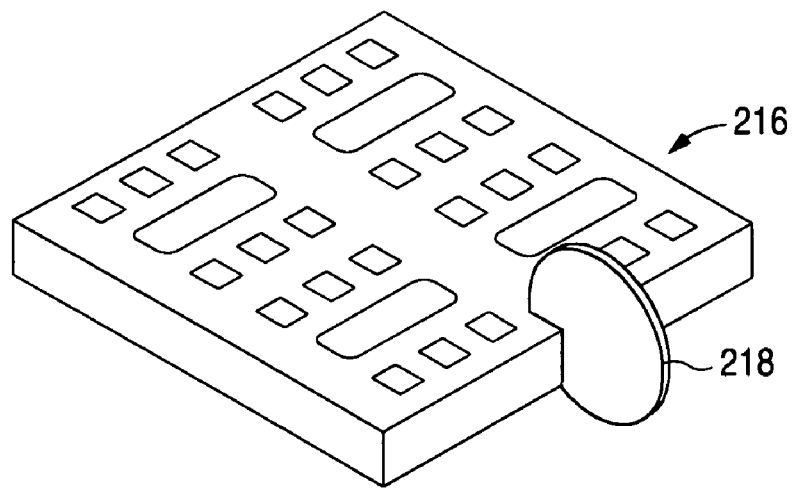
FIG. 11 is a bottom perspective view of a strip block according to an embodiment of the present invention.

In step 118, the strip block is sawed to separate the encapsulated dies into individual package units. FIG. 11 is a bottom perspective view of the strip block 216 being sawed by a saw blade 218. Since the lead frame has been removed, the saw blade 218 need not cut through the lead frame as it cuts the strip block 216. Thus, the lifespan of the saw blade 218 is improved as compared to saw blades that also cut the lead frame when cutting a strip block. In addition, since the lead frame has been removed, sawing the strip block does not result in metal burrs being produced. Thus, QFN packages manufactured in accordance with the above method have reduced short-circuiting test issues as compared to QFN packages produced with burrs.

Figure 12:
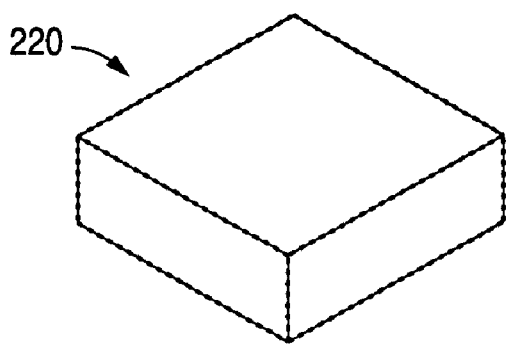
FIG. 12 is a top perspective view of a QFN package unit according to an embodiment of the present invention.
Figure 13:
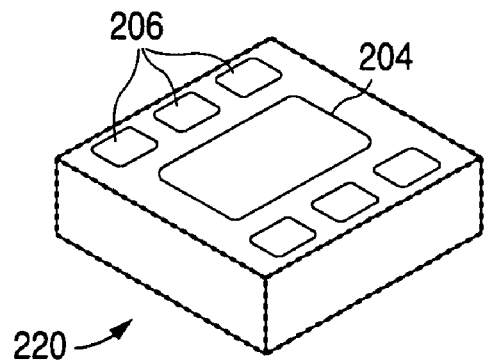
FIG. 13 is a bottom perspective view of the QFN package unit of FIG. 12.

FIG. 12 is a top perspective view of a QFN package unit 220 resulting from the strip block 216 having been sawed into individual units. FIG. 13 is a bottom perspective view of the QFN package unit 220. The die pad 204 and the lead shrinks 206 can be seen.

Figure 14:
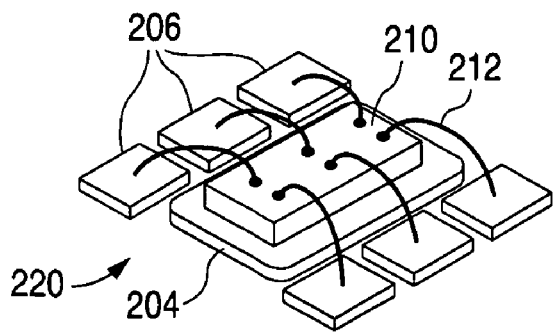
FIG. 14 is cut-away top perspective view of the QFN package unit of FIG. 12.

FIG. 14 is cut-away top perspective view of the QFN package unit 220. The molding compound has been cut away to show the die pad 204, the lead shrinks 206, the wire leads 212, and the die 210.

Figure 15:
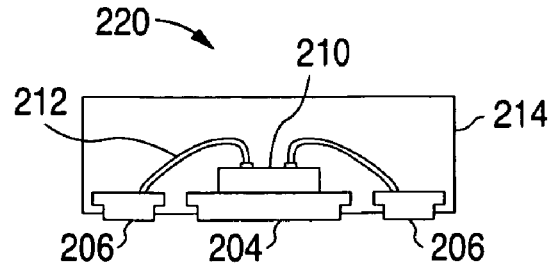
FIG. 15 is a cross-sectional view of the QFN package unit of FIG. 12.

FIG. 15 is a cross-sectional view of the QFN package unit 220. The molding compound 214, the die pad 204, the lead shrinks 206, the wire leads 212, and the die 210 can be seen.

As can be seen from the above description, embodiments of the present invention improve upon QFN chip package fabrication processes. First, wire bonds have improved quality. Second, the lifespan of the saw blades is increase. Third, the packages have no burrs.

Although the above description of the preferred embodiments has focused on QFN chip packages, such discussion is mainly for illustrative purposes. Similar principles may be applied to other types of chip packaging processes as desired.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims. The terms and expressions that have been employed here are used to describe the various embodiments and examples. These terms and expressions are not to be construed as excluding equivalents of the features shown and described, or portions thereof, it being recognized that various modifications are possible within the scope of the appended claims.

What is claimed is:

1. A method of fabricating a chip package, comprising the steps of:
   forming a stamped lead frame by stamping a thin metal material;
   forming a die pad and a lead shrink on one side of said stamped lead frame;
   mounting a die on said die pad;
   wire bonding between said die and said lead shrink to produce a wire bond therebetween;
   encapsulating said die and said wire bond with a molding compound on said one side of said stamped lead frame;
   removing said stamped lead frame after said step of encapsulating; and
   sawing said molding compound after said step of removing said stamped lead frame.

2. The method of claim 1, wherein said step of forming said stamped lead frame includes providing said thin metal material having a thickness of between approximately 0.10 mm and 0.30 mm.

3. The method of claim 1, wherein said step of forming said stamped lead frame includes stamping a hole in said thin metal material.

4. The method of claim 1, wherein said thin metal material comprises a copper alloy material.

5. The method of claim 1, wherein said die pad and said lead shrink are formed on a top side of said stamped lead frame.

6. The method of claim 1, wherein said step of performing wire bonding is performed in an absence of mounting tape.

7. The method of claim 1, wherein said step of encapsulating excludes encapsulating said stamped lead frame.

8. A chip package, said chip package produced by a method comprising the steps of:
   forming a stamped lead frame by stamping a thin metal material;
   forming a die pad and a lead shrink on one side of said stamped lead frame;
   mounting a die on said die pad;
   wire bonding between said die and said lead shrink to produce a wire bond therebetween;
   encapsulating said die and said wire bond with a molding compound on said one side of said stamped lead frame;
   removing said stamped lead frame after said step of encapsulating; and
   sawing said molding compound after said step of removing said stamped lead frame.

9. The chip package of claim 8, wherein said step of forming said stamped lead frame includes providing said thin metal material having a thickness of between approximately 0.10 mm and 0.30 mm.

10. The chip package of claim 8, wherein said step of forming said stamped lead frame includes stamping a hole in said thin metal material.

11. The chip package of claim 8, wherein said thin metal material comprises a copper alloy material.

12. The chip package of claim 8, wherein said die pad and said lead shrink are formed on a top side of said stamped lead frame.

13. The chip package of claim 8, wherein said step of performing wire bonding is performed in an absence of mounting tape.

14. The chip package of claim 8, wherein said step of encapsulating excludes encapsulating said stamped lead frame.

* * * * *